(12) United States Patent
Luciano

(10) Patent No.: US 12,055,568 B2
(45) Date of Patent: Aug. 6, 2024

(54) DUAL CURRENT SENSING

(71) Applicant: NXP USA, Inc., Austin, TX (US)

(72) Inventor: Giuseppe Luciano, Brugherio (IT)

(73) Assignee: NXP USA, Inc., Austin, TX (US)

( * ) Notice: Subject to any disclaimer, the term of this patent is extended or adjusted under 35 U.S.C. 154(b) by 34 days.

(21) Appl. No.: 17/874,163

(22) Filed: Jul. 26, 2022

(65) Prior Publication Data

US 2024/0036086 A1     Feb. 1, 2024

(51) Int. Cl.
*G01R 19/00* (2006.01)

(52) U.S. Cl.
CPC .............................. *G01R 19/0092* (2013.01)

(58) Field of Classification Search
CPC .................................................. G01R 19/0092
See application file for complete search history.

(56) References Cited

U.S. PATENT DOCUMENTS

| | | | |
|---|---|---|---|
| 6,853,174 B1 | 2/2005 | Inn | |
| 10,041,982 B2 | 8/2018 | Hu et al. | |
| 11,441,505 B2* | 9/2022 | Shirakawa | F02M 51/061 |
| 2005/0127888 A1* | 6/2005 | Marschalkowski | G01R 19/0092 323/313 |
| 2010/0277142 A1* | 11/2010 | Tan | H02M 7/53803 323/268 |
| 2011/0050185 A1 | 3/2011 | Notman et al. | |
| 2011/0068762 A1 | 3/2011 | Nishida | |
| 2013/0154595 A1* | 6/2013 | Drinovsky | G05F 1/46 323/282 |
| 2014/0347078 A1 | 11/2014 | Qin | |
| 2017/0063228 A1 | 3/2017 | Kimura et al. | |
| 2018/0226877 A1* | 8/2018 | Fukumoto | H02M 3/1588 |
| 2019/0165676 A1* | 5/2019 | Nogawa | H02M 3/158 |
| 2019/0379270 A1 | 12/2019 | Pullen et al. | |
| 2020/0158808 A1* | 5/2020 | Newlin | G01R 35/005 |
| 2020/0309824 A1* | 10/2020 | Kimura | G05F 3/262 |

(Continued)

FOREIGN PATENT DOCUMENTS

CN          107659151 A         2/2018

OTHER PUBLICATIONS

Chen, Jiann-Jong et al. "Integrated Current Sensing Circuit Suitable for Step-Down DC-DC Converters", 2004 35th Annual IEEE Power Electronics Specialists Conference, Aaclten, Germany. 2004, pp. 1140-1142.

(Continued)

*Primary Examiner* — Dominic E Hawkins

(57) ABSTRACT

Provided is a current-sensing circuit that includes a power-supply line providing electrical power to a high side of a load, a high-side field-effect transistor (FET) component between the power-supply line and the high side of the load, and a low-side FET component coupled to a low side of the load. Gate signals continually repeat a cycle that includes: a first part in which the high-side FET component is turned on and the low-side FET component is turned off, and a second part in which the high-side FET component is turned off and the low-side FET component is turned on. In addition, a single transconductance stage is configured to: input signals indicating a voltage drop across whichever one of the high-side FET component or the low-side FET component currently is on, and output a signal indicating a current flow that corresponds to such voltage drop.

21 Claims, 3 Drawing Sheets

(56) References Cited

U.S. PATENT DOCUMENTS

| | | | |
|---|---|---|---|
| 2021/0099116 A1* | 4/2021 | Krishnamurthy | H02P 7/04 |
| 2021/0159787 A1* | 5/2021 | Gibson | H02M 3/158 |
| 2023/0095105 A1* | 3/2023 | Brink | H02M 3/158 |
| | | | 323/271 |

OTHER PUBLICATIONS

Ha, Jung-Woo et al.; "A Fast Response Integrated Current-Sensing Circuit for Peak-Current-Mode Buck Regulator"; 2013 Proceedings of the ESSCIRC (ESSCIRC); Sep. 22, 2014; pp. 155-158.
Chan, Man Pun et al.; "On-Chip Digital Inductor Current Sensor for Monolithic Digitally Controlled DC-DC Converter"; IEEE Transactions on Circuits and Systems I: Regular Papers; vol. 60, No. 5; May 2013; pp. 1232-1240.

* cited by examiner

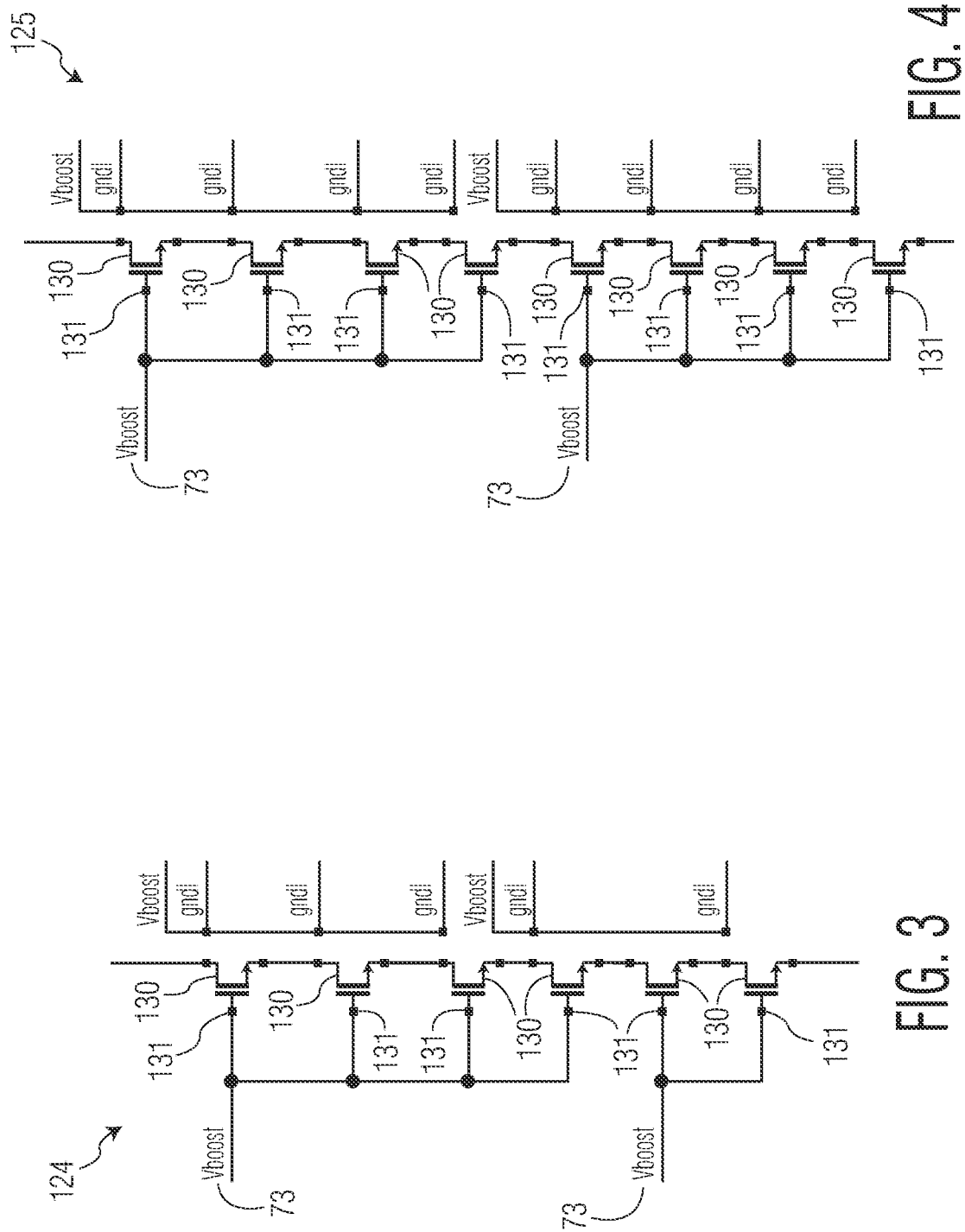

DUAL CURRENT SENSING

FIELD OF THE INVENTION

The present invention pertains, among other things, to circuits, systems, methods and techniques for sensing the current flow through a load, from both the high side and the low side of the load.

BACKGROUND

The following discussion concerns certain background information related to the present invention, including discussion of some relevant prior art. In certain instances, the following discussion also provides the present inventor's (1) identification and analysis of some of the problems related to the present invention and/or (2) observations regarding and/or characterizations of the prior art. However, it should be understood that only knowledge clearly, explicitly and specifically described herein as being "conventional" or "prior art" is intended to be characterized as such. Everything else should be understood as knowledge and/or insight originating from the present inventor.

In many conventional systems, electrical power is delivered to a load, such as an electronic circuit or an electrical component, which then uses the supplied electrical power to perform some desired function. In order to protect the system, circuitry commonly is provided to monitor the electrical current flow through the load and then take appropriate action if such current flow becomes excessive.

Any of a variety of different approaches can be employed to monitor such current flow. For example, it often is the case that a field-effect transistor (FET) is used to switch power on and off to the load. In such cases, one current-sensing approach is to measure the voltage drop across such power FET, and then determine the current flow based on that voltage drop and the known resistance of the FET when turned on. According to one variation on this general configuration, the power FET is placed at the high side of the load (between the power source and the load), and according to another, the power FET is placed at the low side of the load (between the load and ground).

As is known in the art, each of these variations (high-side or low-side current sensing) has its own benefits and limitations, so designers often just select the option that they believe is best in connection with the particular situation, choosing to simply accept the limitations of the selected option. However, another possibility is to employ two entirely separate circuits—one for sensing the high-side current and another for sensing the low-side current. Unfortunately, in addition to the extra cost of such an approach (e.g., in terms of additional circuitry), the present inventor has discovered other downsides to this approach, such as frequent mismatches between the high-side and low-side current sense gain.

SUMMARY OF THE INVENTION

The present invention addresses the foregoing problems, e.g., by using a single circuit, employing just a single transconductance stage (or other current-sensing circuitry) to measure both high-side and low-side current flows through a load.

Thus, one embodiment of the invention is directed to a current-sensing circuit that includes a power-supply line providing electrical power to a high side of a load, a high-side field-effect transistor (FET) component between the power-supply line and the high side of the load, and a low-side FET component coupled to a low side of the load. Gate signals continually repeat a cycle that includes: a first part in which the high-side FET component is turned on and the low-side FET component is turned off, and a second part in which the high-side FET component is turned off and the low-side FET component is turned on. In addition, a single transconductance stage is configured to: input signals indicating a voltage drop across whichever one of the high-side FET component or the low-side FET component currently is on, and output a signal indicating a current flow that corresponds to such voltage drop.

Another embodiment is directed to a current-sensing system that includes a power-supply line providing electrical power to a high side of a load, a high-side electronic switch between the power-supply line and the high side of the load, and a low-side electronic switch coupled to a low side of the load. Control signals continually repeat a cycle that includes: a first part in which the high-side electronic switch is turned on and the low-side electronic switch is turned off, and a second part in which the high-side electronic switch is turned off and the low-side electronic switch is turned on. In addition, a single transconductance stage is configured to: input signals indicating a voltage drop across whichever one of the high-side electronic switch or the low-side electronic switch currently is on, and output a signal indicating a current flow that corresponds to that voltage drop.

Certain more-specific implementations of either of the foregoing embodiments include one or more of the following features.

When the high-side FET component (or other electronic switch) is turned on, the input signals to the single transconductance stage (or other current-sensing circuit) correspond to a portion of current flow through the high-side FET component (or other electronic switch) that also flows through the load, and when the low-side FET component (or other electronic switch) is turned on, the input signals to the single transconductance stage (or other current-sensing circuit) correspond to a portion of current flow through the low-side FET component (or other electronic switch) that also flows through the load;

Also included are a high-side replica FET component (or other electronic switch) and a low-side replica FET component (or other electronic switch), and at least one of the signals input into the single transconductance stage (or other current-sensing circuit) is provided by at least one of the source or drain terminal of at least one of the high-side replica FET component (or other electronic switch) or the low-side replica FET component (or other electronic switch);

The drain terminal of the high-side replica FET component (or other electronic switch) is coupled to the drain terminal of the high-side FET component (or other electronic switch), and the source terminal of the low-side replica FET component (or other electronic switch) is coupled to the source terminal of the low-side FET component (or other electronic switch);

The high-side replica FET component (or other electronic switch) is turned on and off at the same times as the high-side FET component (or other electronic switch), and the low-side replica FET component (or other electronic switch) is turned on and off at the same times as the low-side FET component (or other electronic switch).

The gate signals (or control signals) have a frequency within a range of 100 kHz-5 MHz;

The transconductance stage (or other current-sensing circuit) is supplied with power by a pair of power rails, and at least one of the power rails is switched depending upon whether the cycle being executed is in the first part or the second part;

Also included is a boost capacitor that is charged to a boosted voltage, higher than the power-supply line voltage;

The boosted voltage is used to switch on the high-side FET component (or other electronic switch) or the low-side FET component (or other electronic switch), as applicable, depending upon whether the cycle being executed is in the first part or the second part;

The single transconductance stage (or other current-sensing circuit) is supplied with power by a first power rail and a second power rail, and the first power rail is coupled to the boosted voltage;

The second power rail is switched depending upon whether the cycle being executed is in the first part or the second part;

The second power rail is switched using a first rail-switching transistor that is turned on and off concurrently with the high-side FET component (or other electronic switch) and a second rail-switching transistor that is turned on and off concurrently with the low-side FET component (or other electronic switch);

When the cycle being executed is in the first part the second power rail is switched to a voltage applied to the high side of the load, and when the cycle being executed is in the second part the second power rail is switched to ground;

The low-side FET component (or other electronic switch) is disposed between the low side of the load and, through an inductor, the high side of the load;

The high-side FET component (or other electronic switch) also is coupled to the high side of the load through the inductor;

During the first part of the cycle the inductor stores energy, and during the second part of the cycle the inductor provides the energy stored during the first part of the cycle to the load;

At least one of the high-side FET component (or other electronic switch) and the low-side replica FET component (or other electronic switch) includes at least 2 FETs;

Also included is a capacitance in parallel with the load to reduce voltage variations across the load; and/or The single transconductance stage (or other current-sensing circuit) also includes blanking circuitry, active during transitions from the first part to the second part of the cycle and during transitions from the second part to the first part of the cycle, for shunting high-frequency noise to ground.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the accompanying drawings. However, it should be understood that the drawings merely depict certain representative and/or exemplary embodiments and features of the present invention and are not intended to limit the scope of the invention in any manner. The following is a brief description of each of the accompanying drawings.

FIG. 3 is a diagram illustrating circuitry for replacing one of the resistors shown in FIG. 2.

FIG. 4 is a diagram illustrating circuitry for replacing another of the resistors shown in FIG. 2.

DESCRIPTION OF THE PREFERRED EMBODIMENT(S)

Figure 1:
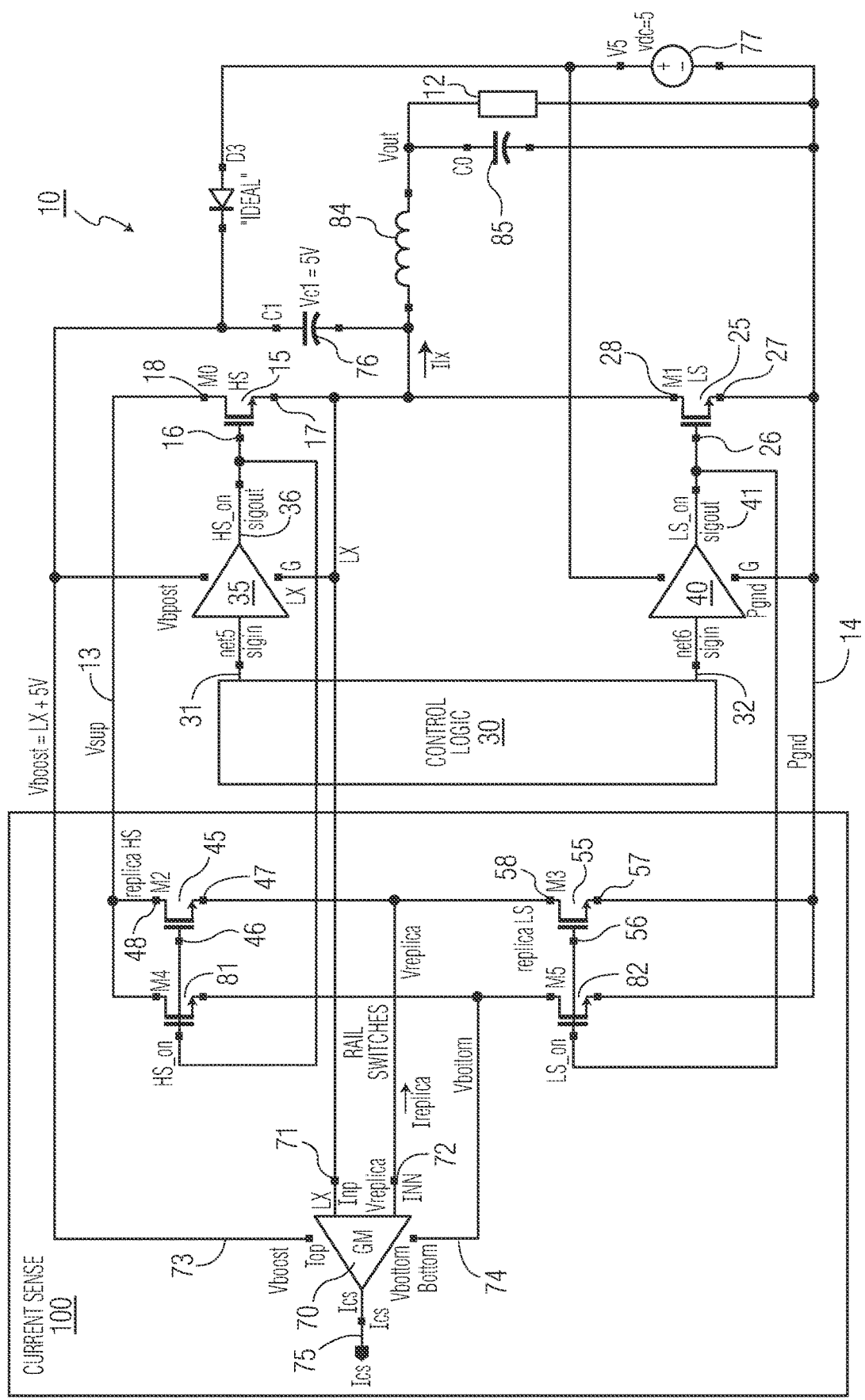
FIG. 1 is diagram of a circuit for measuring both high-side and low-side current flows through a load.

FIG. 1 is diagram of a circuit 10 for sensing or monitoring both high-side and low-side current flows through a load 12. In circuit 10, a supply voltage Vsup (e.g., provided by a power source, not shown, connected between power-supply line 13 and ground line 14) on power-supply line 13 is the ultimate source of power or current flow that is provided to load 12. In the current embodiment, Vsup is approximately 12 volts (V), but different voltages can be used in other embodiments. As discussed in greater detail below, when load 12 is desired to be turned on, current flow is provided to the load 12 by continually alternating between states in which: (1) the high-side FET component 15 is turned on while the low-side FET component 25 is turned off, and then (2) the high-side FET component 15 is turned off while the low-side FET component 25 is turned on.

For the purpose of alternating between such states, in the current embodiment control logic 30 outputs a pair of control signals 31 and 32, with high-side control signal 31 controlling the high-side FET component 15 and low-side control signal 32 controlling the low-side FET component 25. High-side amplifier 35 inputs control signal 31, and outputs a gate signal 36 to the gate 16 of high-side FET component 15, and similarly, low-side amplifier 40 inputs control signal 32 and outputs a gate signal 41 to the gate 26 of low-side FET component 25.

In the current embodiment, based on high-side control signal 31, high-side gate signal 36 (for high-side FET component 15) switches between the voltage LX (i.e., the same voltage that is at the source terminal 17 of the high-side FET component 15), at which point the high-side FET component 15 is turned off, and approximately 5 volts (V) (or BS, as discussed below) above LX, at which point the high-side FET component 15 is turned on. It is noted that unless specified otherwise herein, stated voltages are in reference to Pgnd 14. Based on low-side control signal 32, low-side gate signal 41 (for low-side FET component 25) switches between Pgnd 14 (i.e., the voltage at the source terminal 27 of the low-side FET component 25), at which point the low-side FET component 25 is turned off, and 5V (or BS) above Pgnd 14, at which point the low-side FET component 25 is turned on.

High-side control signal 31 and, correspondingly, high-side gate signal 36 preferably is each provided as a square wave, having a duty cycle of approximately 50% and a frequency within the range of 100 kilohertz (kHz)-5 megahertz (MHz), more preferably, within the range of approximately 200 kHz-4 MHz, and in certain specific embodiments, within the range of approximately 400 kHz-3 MHz so as to repeatedly turn high-side FET component 15 on and then off. In the current configuration, low-side gate signal 41 is the inverse of high-side gate signal 36, so that low-side FET component 25 is turned on when high-side FET component 15 is turned off, and vice versa.

Circuit 10 also includes a high-side replica FET component 45 and a low-side replica FET component 55. As shown, in the current embodiment, the drain terminal 48 of the high-side replica FET component 45 is coupled (e.g., directly connected) to the drain terminal 18 of the high-side FET component 15, and the source terminal 57 of the low-side replica FET component 55 is coupled (e.g. directly connected) to the source terminal 27 of the low-side FET component 25. The same gate signal 36 provided to the gate 16 of the high-side FET component 15 also is applied to the gate terminal 46 of the high-side replica FET component 45, so that both are turned on and off simultaneously. Similarly, the same gate signal 41 provided to the gate 26 of the low-side FET component also is applied to the gate 56 of the low-side replica FET component 55, so that both are turned on and off simultaneously. Preferably, high-side replica FET component 45 is identical to high-side FET component 15, and the two are placed physically close to each other so as to be at substantially the same temperature. Similarly, in the preferred embodiments, low-side replica FET component 55 is identical to low-side FET component and the two are placed physically close to each other so as to be at substantially the same temperature. As shown, generally speaking, the combination of replica FET components 45 and 55 mirrors the configuration of, and is connected in parallel with, FET components 15 and 25, but the replica FET components 45 and 55 are isolated from the current flow through the load 12.

A single transconductance stage 70 also is provided and is configured within circuit 10 so as to alternately measure the load 12's high-side current flow and its low-side current flow (i.e., the portion of the current flow through high-side FET component 15 and the current flow through low-side FET component 25, respectively, that also flows through the load 12). As shown, the first input 71 to transconductance stage 70 is LX (i.e., the voltage at the source terminal 17 of the high-side FET component 15 and/or at the drain terminal 28 of the low-side FET component 25), and its second input 72 is Vreplica (i.e., the voltage at the source terminal 47 of the high-side replica FET component 45 and/or at the drain terminal 58 of the low-side replica FET component 55). In other words, the first input 71 to transconductance stage 70 is the voltage drop across whichever one of high-side FET component 15 and low-side FET component 25 currently is on, and the second input 72 to transconductance stage 70 is the voltage drop across whichever one of high-side replica FET component 45 and low-side replica FET component 55 currently is on. The top power rail 73 supplying transconductance stage 70 in circuit 10 is at Vboost, and the bottom power rail 74 for transconductance stage 70 is at Vbottom. Output 75 of transconductance stage 70 is provided with a signal that is indicative of (e.g., identical or proportional to) such high-side or low-side current flow, as applicable.

Here, Vboost is the voltage, boosted above Vsup, resulting from the use of boost capacitor 76, in combination with boost supply 77. As a result, Vboost typically has a value of LX+BS, with LX as noted above and BS being the voltage provided by boost supply 77, which is 5 V in the current embodiment. Due to the configuration of circuit 10, LX changes depending upon the state of circuit 10, i.e., the then-current part of the cycle of control signals 31 and 32, while BS remains constant. Vbottom, the voltage supplied to the bottom power rail 74 of transconductance stage 70, is switched between two different levels, corresponding to the two parts of the cycle of control signals 31 and 32. For this purpose, circuit 10 includes a pair of rail-switching FET components 81 and 82, with high-side rail-switching FET component 81 being switched on and off simultaneously with high-side FET component 15 and/or high-side replica FET component 45, and with low-side rail-switching FET component 82 being switched on and off simultaneously with low-side FET component 25 and/or low-side replica FET component 55. As a result, when high-side FET component 15 is turned on, Vbottom is close to Vsup, and when low-side FET component 25 is turned on, Vbottom is close to Pgnd 14.

In the current embodiment, circuit 10 operates as follows. Initially, as noted above, when power is to be delivered to load 12, control logic 30 outputs control signals 31 and 32 in accordance with a repeating two-part cycle.

During the first part of that cycle, in the current embodiment high-side control signal 31 is high and low-side control signal 32 is low. With high-side control signal 31 high, high-side amplifier 35 outputs a gate signal 36 equal to LX (i.e., the voltage at the source terminal 17 of high-side FET component 15) plus the voltage BS across boost capacitor 76 (which is 5 V in the current embodiment), thereby turning on high-side FET component 15, high-side replica FET component 45 and high-side rail-switching FET component 81. At the same time, low-side FET component 25, low-side replica FET component 55 and low-side rail-switching FET component 82 (having Pgnd 14 supplied to their gate terminals) are turned off. In this part of the cycle, current flows from power-supply line 13, through high-side FET component 15 and inductor 84 to load 12, ramping up as energy is stored by inductor 84, but with output capacitor 85 reducing the voltage fluctuation that otherwise would occur across (and therefore also the current through) the load 12. As also noted above, the inputs to the transconductance stage are LX (the voltage at the source terminal 17 of the high-side FET component 15) and Vreplica (the voltage at the source terminal 47 of the high-side replica FET component 45), which in this part of the cycle correspond to the voltage drop across high-side FET component 15 resulting from the current flow through it that also flows through the load 12.

In the second part of the cycle, high-side control signal 31 is low and low-side control signal 32 is high. With low-side control signal 32 high, amplifier 40 outputs a gate signal 41 equal to Pgnd 14 (i.e., the voltage at the source terminal 27 of low-side FET component 25) plus the voltage BS provided by boost supply 77 (which is 5 V in the current embodiment), thereby turning on low-side FET component 25, low-side replica FET component 55 and low-side rail-switching FET 82. At the same time, high-side FET component 15, high-side replica FET component 45 and high-side rail-switching FET 81 (having LX supplied to their gate terminals) are turned off. In this part of the cycle, stored energy in inductor 84 provides current flow through load 12 and then through low-side FET component 25, but the amount of such current flow declines as stored energy is released from inductor 84. However, once again, output capacitor 85 reduces the voltage fluctuation that otherwise would occur across (and therefore also the current through) the load 12. In this part of the cycle, the inputs 71 and 72 to the transconductance stage, LX (the voltage at the drain terminal 28 of the low-side FET component 25) and Vreplica (the voltage at the drain terminal 58 of the low-side replica FET component 55), correspond to the voltage drop across low-side FET component 25 resulting from the current flow through it that also is flowing through the load 12.

In the current embodiment, control signals 31 and 32 have a frequency of 2.2 MHz, inductor 84 has a value of 1-3 microhenries (µH), boost capacitor 76 has a value of 15-100 nanofarads (nF), and output capacitor 85 has a value of 20-200 microfarads (μF). Preferably, such component values depend upon the frequency of control signals 31 and 32, as well as the load 12.

Figure 2:
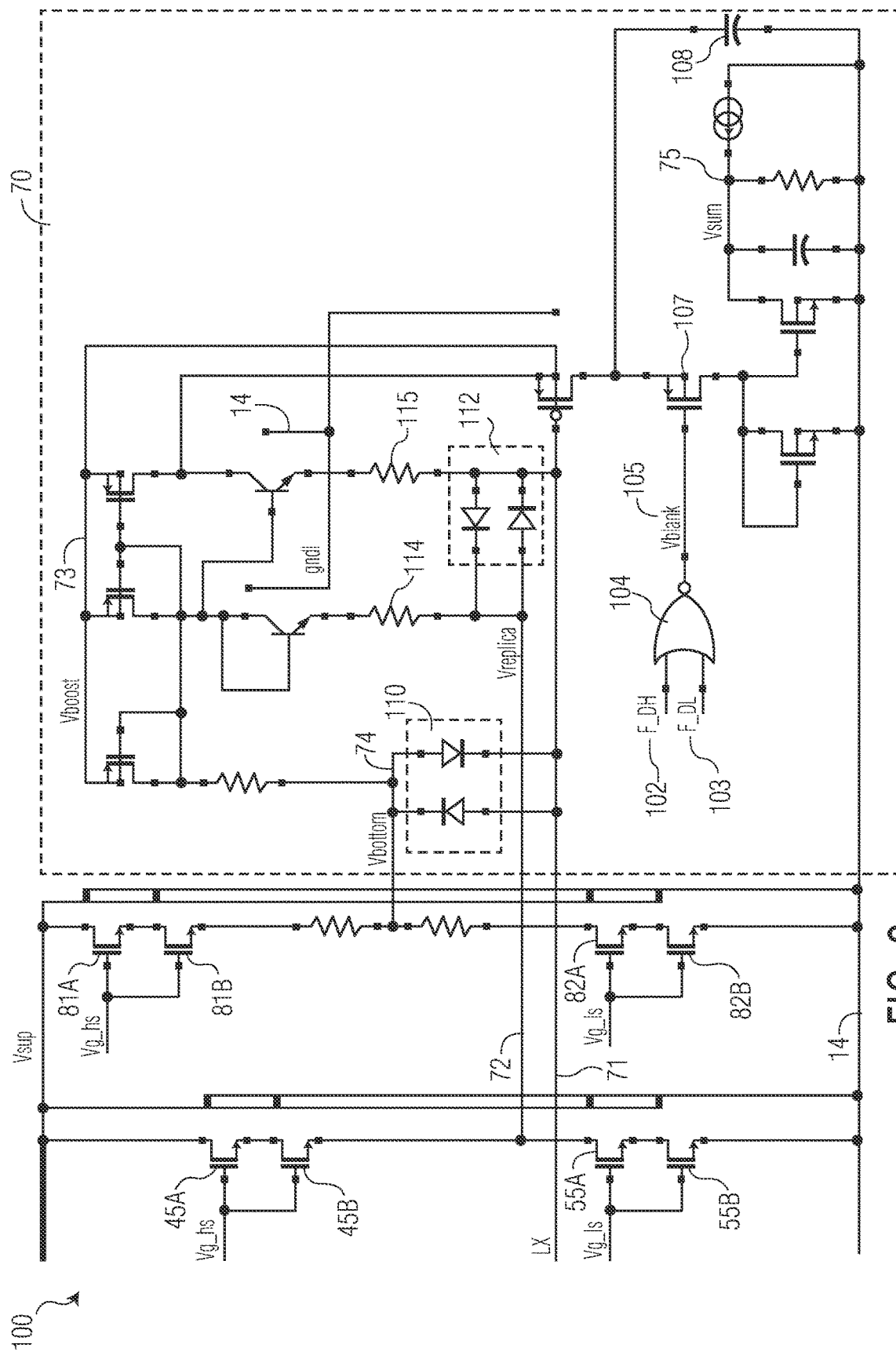
FIG. 2 is a diagram of the current-sensing portion of the circuit shown in FIG. 1, according to a representative embodiment of the present invention.

FIG. 2 is a more-detailed diagram of the current-sensing portion 100 of circuit 10, according to one representative embodiment of the present invention. In this embodiment, high-side replica FET component 45 is implemented as two series-connected FETs 45A and 45B, low-side replica FET component 55 is implemented as two series-connected FETs 55A and 55B, high-side rail-switching FET component 81 is implemented as two series-connected FETs 81A and 81B, and low-side rail-switching FET component 82 is implemented as two series-connected FETs 82A and 82B. It is noted that in other embodiments, any or all of such FET components can be implemented using any number of series-connected and/or parallel-connected FETs.

As also shown, in this embodiment, transconductance stage 70 includes several additional features beyond what is ordinarily included in a typical conventional transconductance stage. For instance, in this embodiment, in addition to control signals 31 and 32, control logic 30 (shown in FIG. 1) also outputs blanking signals 102 and 103, with blanking signal 102 being high for a brief period of time (e.g., a few nanoseconds) during the transition between when the high-side FET component 15 is on and when the low-side FET component 25 is on, and with blanking signa 103 being high for a brief period of time (e.g., a few nanoseconds) during the transition between when the low-side FET component 25 is on and when the high-side FET component 15 is on. Blanking signals 102 and 103 are input to NOR gate 104, which outputs a composite blanking signal 105, which in the current embodiment is low during either transition. As a result, during such transitions blanking FET 107 is turned off, eliminating that electrical path, so that any high-frequency "ringing" during such transitions is shunted to ground through blanking capacitor 108. In addition, in order to further limit any such potential ringing, diode pairs 110 and 112 (each including a pair of parallel-connected oppositely oriented diodes) clamp the differential voltage inputs 71 and 72, respectively.

In FIG. 2, resistors 114 and 115 are used to get a large linearity range from the transconductance stage 70. In the embodiments in which they are used, resistors 114 and 115 preferably have the same value (i.e., R114=R115), and that value depends on the desired current-sense gain. For example, assuming a desired Gain=Ics/Iout=20 uA/1 Amp, since Ics/Iout=Rfet/R114 (or R115 because R115=R114) =>R114=R115=Rfet/Gain, so if Rfet=0.1 Ohm, then R114=R115=0.1/20 μA*1 Amp=5 KOhm.

However, in more preferred embodiments, FET transistors are used to obtain the desired resistance. Thus, in one such embodiment, resistor 114 is replaced by a series 124 of FET transistors 130 (e.g., as shown in FIG. 3), and resistor 115 is replaced by a series 125 of FET transistors 130 (e.g., as shown in FIG. 4). As shown, the gate 131 of each such transistor 130 preferably is supplied by Vboost 73.

Additional Considerations

The expression "FET component" as used herein is intended to include a single FET or a combination of FETs connected in series and/or in parallel. When the present discussion and/or drawing(s) refer to a FET component being coupled to another component or to a particular node, such references mean that the drain or source of such FET component is coupled to such component or node; similarly, any references to a FET component being coupled between to components or nodes are referring to the path from drain to source or vice versa. Also, it should be understood that references herein to a FET or a FET component can be replaced with other kinds of transistors, transistor circuits or other electronic switches.

As used herein, the term "coupled", or any other form of the word, is intended to mean either directly connected or connected through one or more other components, elements or processing blocks, e.g., for the purpose of preprocessing. In the drawings and/or the discussions of them, where individual steps, components, modules or processing blocks are shown and/or discussed as being directly connected to each other, such connections should be understood as couplings, which may include additional steps, components, modules, circuit elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein, except to the extent expressly stated otherwise.

Whenever a specific value is mentioned herein, such a reference is intended to include that specific value or substantially or approximately that value. In this regard, the foregoing use of the word "substantially" is intended to encompass values that are not substantially different from the stated value, i.e., permitting deviations that would not have substantial impact within the identified context. For example, stating that a continuously variable signal level is set to a particular value should be understood to include values within a range around such specifically stated value that produce substantially the same effect as the specifically stated value. For example, the identification of a single length, width, depth, thickness, etc. should be understood to include values within a range around such specifically stated value that produce substantially the same effect as the specifically stated value. As used herein, except to the extent expressly and specifically stated otherwise, the term "approximately" can mean, e.g.: within ±10% of the stated value or within ±20% of the stated value.

In the preceding discussion, the terms "operators", "operations", "functions" and similar terms refer to method or process steps or to hardware components, depending upon the particular implementation/embodiment.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints.

In the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

As used herein, the words "include", "includes", "including", and all other forms of the word should not be understood as limiting, but rather any specific items following such words should be understood as being merely exemplary.

Several different embodiments of the present invention are described above and/or in any documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof, as limited solely by the claims appended hereto.

What is claimed is:

1. A current-sensing circuit, comprising:
    a power-supply line that provides electrical power to a high side of a load;
    a high-side field-effect transistor (FET) component disposed between the power-supply line and the high side of the load;
    a low-side FET component coupled to a low side of the load;
    control logic configured to generate a plurality of gate signals continually repeating a cycle that includes:
        a first part in which the high-side FET component is turned on and the low-side FET component is turned off, and
        a second part in which the high-side FET component is turned off and the low-side FET component is turned on;
    a high-side replica FET component, having a first terminal coupled to the power-supply line;
    a low-side replica FET component, having a first terminal coupled to a second terminal of the high-side replica FET component and a second terminal coupled to a ground;
    a current-sensing circuit configured to:
        receive a first input signal from a node between the second terminal of the high-side replica FET component and the first terminal of the low-side replica FET component;
        receive a second input signal from a node between the high side of the load and the low side of the load;
        wherein the first and second input signals indicate a voltage drop across whichever one of the high-side FET component or the low-side FET component currently is on, and
        output a signal indicating a current flow that corresponds to said voltage drop.

2. The current-sensing circuit of claim 1,
    wherein when the high-side FET component is turned on, the input signals to the current-sensing circuit correspond to a portion of current flow through the high-side FET component that also flows through the load, and
    wherein when the low-side FET component is turned on, the input signals to the current-sensing circuit correspond to a portion of current flow through the low-side FET component that also flows through the load.

3. The current-sensing circuit of claim 1,
    wherein the first input signal is provided by the source terminal of the high-side replica FET component and the drain terminal of the low-side replica FET component.

4. The current-sensing circuit of claim 3, wherein
    the drain terminal of the high-side replica FET component is coupled to the drain terminal of the high-side FET component, and
    the source terminal of the low-side replica FET component is coupled to the source terminal of the low-side FET component.

5. The current-sensing circuit of claim 3, wherein
    the high-side replica FET component is turned on and off at the same times as the high-side FET component, and
    the low-side replica FET component is turned on and off at the same times as the low-side FET component.

6. The current-sensing circuit of claim 1,
    wherein the gate signals have a frequency within a range of 100 kHz-5 MHz.

7. The current-sensing circuit of claim 1,
    wherein the current-sensing circuit is supplied with power by a pair of power rails, and
    wherein at least one of said power rails is switched between at least two different voltage levels depending upon whether the cycle being executed is in the first part or the second part.

8. The current-sensing circuit of claim 1,
    further comprising a boost capacitor that is charged to a boosted voltage, higher than the power-supply line voltage.

9. The current-sensing circuit of claim 8,
    wherein the boosted voltage is used to switch on the high-side FET component or the low-side FET component, as applicable, depending upon whether the cycle being executed is in the first part or the second part.

10. The current-sensing circuit of claim 9,
    wherein the current-sensing circuit is supplied with power by a first power rail and a second power rail, and wherein the first power rail is coupled to said boosted voltage.

11. The current-sensing circuit of claim 10,
    wherein the second power rail is switched depending upon whether the cycle being executed is in the first part or the second part.

12. The current-sensing circuit of claim 11,
    wherein the second power rail is switched using
        a first rail-switching transistor that is turned on and off concurrently with the high-side FET component and
        a second rail-switching transistor that is turned on and off concurrently with the low-side FET component.

13. The current-sensing circuit of claim 11, wherein
    when the cycle being executed is in the first part the second power rail is switched to a voltage applied to the high side of the load, and
    when the cycle being executed is in the second part the second power rail is switched to the ground.

14. The current-sensing circuit of claim 1,
    wherein the low-side FET component is disposed between the low side of the load and, through an inductor, the high side of the load.

15. The current-sensing circuit of claim 14,
    wherein the high-side FET component also is coupled to the high side of the load through the inductor.

16. The current-sensing circuit of claim 14, wherein during the first part of the cycle the inductor stores energy, and during the second part of the cycle the inductor provides the energy stored during the first part of the cycle to the load.

17. The current-sensing circuit of claim 1, wherein at least one of the high-side FET component and the low-side replica FET component includes at least 2 FETs.

18. The current-sensing circuit of claim 1, further comprising a capacitance in parallel with the load to reduce voltage variations across the load.

19. The current-sensing circuit of claim 1, wherein the current-sensing circuit also includes blanking circuitry, active during transitions from the first part to the second part of the cycle and during transitions from the second part to the first part of the cycle, for shunting high-frequency noise to the ground.

20. A current-sensing circuit, comprising:

a power-supply line that provides electrical power to a high side of a load;

a high-side field-effect transistor (FET) component disposed between the power-supply line and the high side of the load;

a low-side FET component coupled to a low side of the load;

control logic configured to generate a plurality of gate signals continually repeating a cycle that includes:

a first part in which the high-side FET component is turned on and the low-side FET component is turned off, and a second part in which the high-side FET component is turned off and the low-side FET component is turned on; and a current-sensing circuit configured to:

input signals indicating a voltage drop across whichever one of the high-side FET component or the low-side FET component currently is on;

output a signal indicating a current flow that corresponds to said voltage drop;

wherein the current-sensing circuit is supplied with power by a pair of power rails, and wherein at least one of said power rails is switched between at least two different voltage levels depending upon whether the cycle being executed is in the first part or the second part.

21. A current-sensing circuit, comprising:

a power-supply line that provides electrical power to a high side of a load;

a high-side field-effect transistor (FET) component disposed between the power-supply line and the high side of the load;

a low-side FET component coupled to a low side of the load;

control logic configured to generate a plurality of gate signals continually repeating a cycle that includes:

a first part in which the high-side FET component is turned on and the low-side FET component is turned off, and a second part in which the high-side FET component is turned off and the low-side FET component is turned on; and a current-sensing circuit configured to:

input signals indicating a voltage drop across whichever one of the high-side FET component or the low-side FET component currently is on;

output a signal indicating a current flow that corresponds to said voltage drop; and a boost capacitor that is charged to a boosted voltage, higher than the power-supply line voltage;

wherein the boosted voltage is used to switch on the high-side FET component or the low-side FET component, as applicable, depending upon whether the cycle being executed is in the first part or the second part.

* * * * *